(12) United States Patent
Hsiao et al.

(10) Patent No.: US 11,715,756 B2
(45) Date of Patent: Aug. 1, 2023

(54) DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Tsung-Chieh Hsiao, Changhua (TW); Hsiang-Ku Shen, Hsinchu (TW); Yuan-Yang Hsiao, Taipei (TW); Ying-Yao Lai, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 49 days.

(21) Appl. No.: 17/368,343

(22) Filed: Jul. 6, 2021

(65) Prior Publication Data
US 2022/0328614 A1    Oct. 13, 2022

Related U.S. Application Data

(60) Provisional application No. 63/173,144, filed on Apr. 9, 2021.

(51) Int. Cl.
*H01L 23/00*    (2006.01)
*H01L 49/02*    (2006.01)

(52) U.S. Cl.
CPC .............. *H01L 28/60* (2013.01); *H01L 24/03* (2013.01); *H01L 24/05* (2013.01); *H01L 24/13* (2013.01); *H01L 2224/0401* (2013.01); *H01L 2224/05008* (2013.01); *H01L 2224/05083* (2013.01); *H01L 2224/13024* (2013.01); *H01L 2924/19041* (2013.01); *H01L 2924/19104* (2013.01)

(58) Field of Classification Search
CPC ... H01L 24/03; H01L 21/76885; H01L 24/05; H01L 2224/05008; H01L 2224/13024
See application file for complete search history.

(56) References Cited

U.S. PATENT DOCUMENTS

| | | | |
|---|---|---|---|
| 2009/0115058 A1* | 5/2009 | Yu | H01L 24/02 257/738 |
| 2014/0319680 A1* | 10/2014 | Choi | H01L 24/97 257/737 |
| 2016/0351684 A1* | 12/2016 | Chiu | H01L 29/7848 |

(Continued)

FOREIGN PATENT DOCUMENTS

| | | | | |
|---|---|---|---|---|
| CN | 102496580 A | * | 6/2012 | H01L 24/11 |
| CN | 106816426 A | * | 6/2017 | H01L 21/6835 |

(Continued)

*Primary Examiner* — Mamadou L Diallo
(74) *Attorney, Agent, or Firm* — Nz Carr Law Office

(57) ABSTRACT

A device structure, along with methods of forming such, are described. The device structure includes a structure, a first passivation layer disposed on the structure, a buffer layer disposed on the first passivation layer, a barrier layer disposed on a first portion of the buffer layer, a redistribution layer disposed over the barrier layer, an adhesion layer disposed on the barrier layer and on side surfaces of the redistribution layer, and a second passivation layer disposed on a second portion of the buffer layer. The second passivation layer is in contact with the barrier layer, the adhesion layer, and the redistribution layer.

20 Claims, 9 Drawing Sheets

(56) References Cited

U.S. PATENT DOCUMENTS

| | | | |
|---|---|---|---|
| 2019/0027450 A1* | 1/2019 | Choi | H01L 24/16 |
| 2019/0035728 A1* | 1/2019 | Venegoni | H01L 23/5283 |
| 2019/0206730 A1* | 7/2019 | Jain | H01L 21/76846 |
| 2019/0206817 A1* | 7/2019 | Medina | H01L 24/11 |
| 2020/0035595 A1* | 1/2020 | Wu | H01L 28/40 |
| 2020/0035780 A1 | 1/2020 | Huang et al. | |
| 2020/0388569 A1* | 12/2020 | Pipia | H01L 23/53238 |
| 2021/0074627 A1* | 3/2021 | Liu | H01L 23/49811 |
| 2021/0242146 A1* | 8/2021 | Arvin | H01L 24/11 |
| 2022/0310538 A1* | 9/2022 | Hsiao | H01L 24/03 |

FOREIGN PATENT DOCUMENTS

| | | | | |
|---|---|---|---|---|
| CN | 105070698 B | * | 1/2018 | |
| TW | 201403724 A | * | 1/2014 | H01L 23/3192 |
| WO | WO-2007092176 A2 | * | 8/2007 | H01L 21/28 |

* cited by examiner

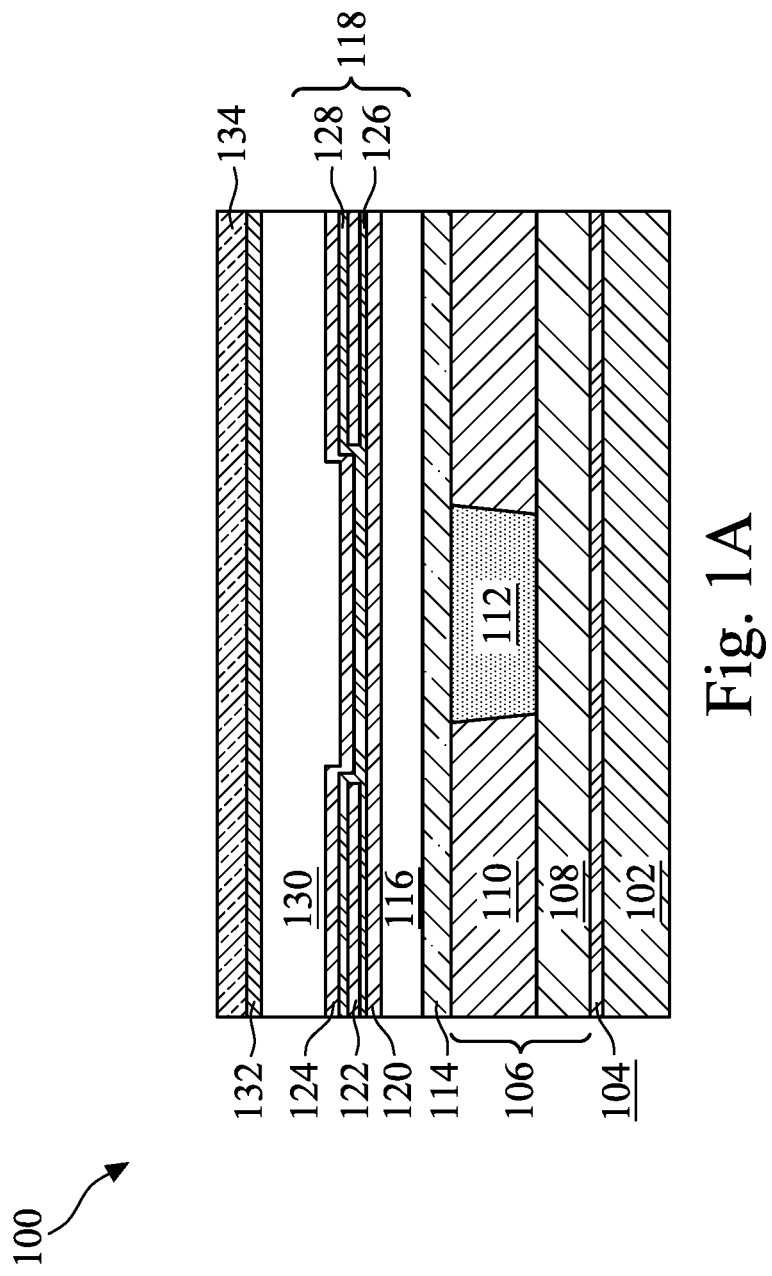

DEVICE STRUCTURE AND METHODS OF FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

One type of capacitor is a metal-insulator-metal (MIM) capacitor, which is used in mixed signal devices and logic devices, such as embedded memories and radio frequency devices. MIM capacitors are used to store a charge in a variety of semiconductor devices. Although existing processes for manufacturing MIM capacitors have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1I are cross-sectional side views of various stages of manufacturing a device structure, in accordance with some embodiments.

DETAILED DESCRIPTION

Figure 1B:
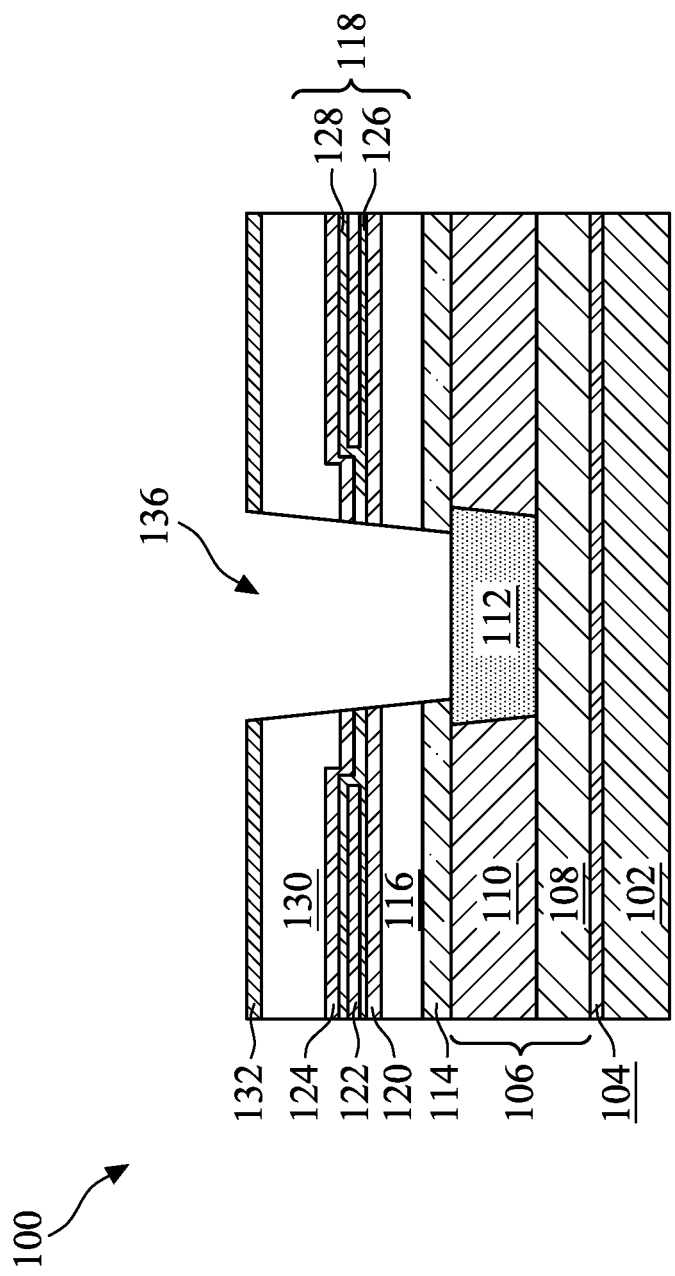

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated in different embodiments. Additional features can be added to the structure. Some of the features described below can be replaced or eliminated in different embodiments. Although some embodiments are discussed with operations performed in a particular order, these operations may be performed in another logical order.

FIGS. 1A-1I are cross-sectional side views of various stages of manufacturing a device structure 100, in accordance with some embodiments. As shown in FIG. 1A, the device structure 100 includes a substrate 102 and a device layer 104 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include various regions that have been suitably doped with impurities (e.g., p-type or n-type impurities). The dopants are, for example phosphorus for an n-type fin field effect transistor (FinFET) and boron for a p-type FinFET.

The device layer 104 includes one or more devices, such as transistors, diodes, imaging sensors, resistors, capacitors, inductors, memory cells, or a combination thereof. In some embodiments, the devices are transistors, such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), or other suitable transistors. The transistors may be planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. The devices in the device layer 104 may be formed by a front end of line (FEOL) process.

As shown in FIG. 1A, the device structure 100 may further include an interconnection structure 106 disposed over the device layer 104 and the substrate 102. The interconnection structure 106 includes an intermetal dielectric (IMD) layer 108 and a plurality of conductive features (not shown) disposed in the IMD layer 108. The conductive features may be conductive lines and conductive vias. The interconnection structure 106 includes multiple levels of the conductive features, and the conductive features are arranged in each level to provide electrical paths to various devices in the device layer 104 therebelow. The conductive features may be made from one or more electrically conductive materials, such as metal, metal alloy, metal nitride, or silicide. For example, the conductive features are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 108 includes one or more dielectric materials to provide isolation functions to various conductive features. The IMD layer 108 may include multiple dielectric layers embedding multiple levels of conductive features. The IMD layer 108 is made from a dielectric material, such as $SiO_x$, $SiO_xC_yH_z$, or $SiO_xC_y$, where x, y and z are integers or non-integers. In some embodiments, the IMD layer 108 includes a dielectric material having a k value ranging from about 1 to about 5.

As shown in FIG. 1A, the interconnection structure 106 may further include a dielectric layer 110 and one or more conductive features 112 formed therein. The dielectric layer 110 may be the top layer of the interconnection structure 106. The dielectric layer 110 may include the same material as the IMD layer 108, and the conductive feature 112 may include the same material as the conductive features formed in the IMD layer 108. A barrier layer (not shown) may be disposed between the conductive feature 112 and the dielectric layer 110. The interconnection structure 106 may be formed by a back end of line (BEOL) process.

An etch stop layer 114 may be disposed on the interconnection structure 106, as shown in FIG. 1A. The etch stop layer 114 may include SiC, SiN, SiCN, SiOC, SiOCN, a metal oxide, a metal nitride, or other suitable material. A dielectric layer 116 is disposed on the etch stop layer 114, a MIM structure 118 is disposed on the dielectric layer 116, and a passivation layer 130 is disposed on the MIM structure 118. The dielectric layer 116 may include the same material as the IMD layer 108. In some embodiments, the dielectric layer 116 has a thickness ranging from about 300 nm to about 500 nm.

The MIM structure 118 includes a first electrode layer 120, a second electrode layer 122 disposed over the first electrode layer 120, and a third electrode layer 124 disposed over the second electrode layer 122. The first, second, and third electrode layers 120, 122, 124 may include an electrically conductive material, such as a metal or a metal nitride. In some embodiments, the first, second, and third electrode layers 120, 122, 124 may include Al, Cu, W, Ti, Ta, TiN, TaN, or other suitable electrically conductive material.

The MIM structure 118 further includes a dielectric layer 126 disposed between the first and second electrode layers 120, 122, and a dielectric layer 128 is disposed between the second and third electrode layers 122, 124. The dielectric layers 126, 128 may include a high-k dielectric material having a k value greater than about 7. In some embodiments, the dielectric layers 126, 128 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or other suitable material. In some embodiments, as shown in FIG. 1A, the second electrode layer 124 is not continuous, and a portion of the MIM structure 118 may include the dielectric layers 126, 128 disposed between the first electrode layer 120 and the third electrode layer 124. The portion of the MIM structure 118 having the dielectric layers 126, 128 disposed between the first electrode layer 120 and the third electrode layer 124 may be removed in subsequent processes to form an opening, and a redistribution layer (RDL) 142 (FIG. 1D) is formed in the opening. Thus, in some embodiments, the MIM structure 118 includes a first electrode layer 120 electrically connected to the RDL 142, a second electrode layer 122 disposed over the first electrode layer 120 and insulated from the RDL 142, and a third electrode layer 124 disposed over the second electrode layer 122 and electrically connected to the RDL 142. In some embodiments, the second electrode layer 122 may be electrically connected to another RDL (not shown). In some embodiments, the MIM structure 118 includes one or more MIM capacitors, such as one or more three-plate MIM capacitors.

A passivation layer 130 is disposed over the MIM structure 118. The passivation layer 130 may include an oxide or SiN. In some embodiments, the passivation layer 130 includes the same material as the dielectric layer 116. In some embodiments, the thickness of the passivation layer 130 may be greater than or equal to the thickness of the dielectric layer 116. For example, the thickness of the passivation layer 130 may range from about 350 nm to about 550 nm.

A buffer layer 132 is disposed on the passivation layer 130, and a mask layer 134 is disposed on the buffer layer 132, as shown in FIG. 1A. The buffer layer 132 may include a metal oxide, such as aluminum oxide ($Al_xO_y$), where x and y may be integers or non-integers. The material of the buffer layer 132 may be different from a material of a subsequently formed barrier layer 138 (FIG. 1C) in order to have different etch selectivity compared to the barrier layer 138. The buffer layer 132 may be formed by any suitable process, such as ALD, CVD, or PVD. In some embodiments, the buffer layer 132 is a conformal layer formed by a conformal process, such as ALD. The term "conformal" may be used herein for ease of description upon a layer having substantial same thickness over various regions. The thickness of the buffer layer 132 may be at least 1 nm in order to function as a stress release buffer layer. In some embodiments, the thickness of the buffer layer 132 ranges from about 1 nm to about 50 nm. If the thickness of the buffer layer 132 is less than about 1 nm, the buffer layer 132 may not be sufficient to release stress. On the other hand, if the thickness of the buffer layer 132 is greater than about 50 nm, manufacturing cost may be increased without significant advantages. In addition, the buffer layer 132 may function as an etch stop layer during a removal of a portion of the barrier layer 138. Thus, in some embodiments, the thickness of the buffer layer 132 depends on the thickness of the barrier layer 138, which is described in detail in FIG. 1C.

The mask layer 134 may include one or more layers. In some embodiments, the mask layer 134 includes a nitride, such as TiN. The mask layer 134 may be patterned by a patterned resist layer (not shown) formed on the mask layer 134. The pattern of the patterned resist layer may be transferred to the mask layer 134, which is then transferred to the layers disposed under the mask layer 134.

As shown in FIG. 1B, an opening 136 is formed in the buffer layer 132, the passivation layer 130, the MIM structure 118, and the etch stop layer 114 to expose the conductive feature 112. The opening 136 may be formed by one or more etch processes. For example, a first etch process may be performed to remove a portion of the mask layer 134 (FIG. 1A) to expose a portion of the buffer layer 132, a second etch process may be performed to remove the exposed portion of the buffer layer 132 to expose a portion of the passivation layer 130, a third etch process may be performed to remove the exposed portion of the passivation layer 130 to expose a portion of the MIM structure 118, a fourth, fifth, and sixth etch processes may be performed to remove the exposed portion of the MIM structure 118 (the first and third electrode layers 120, 124 and the dielectric layers 126, 128) to expose a portion of the dielectric layer 116, a seventh etch process may be performed to remove the exposed portion of the dielectric layer 116 to expose a portion of the etch stop layer 114, and an eighth etch process may be performed to remove the exposed portion of the etch stop layer 114 to expose the conductive feature 112. More or less etch processes may be performed to form the opening 136. The etch processes may be dry etch processes, wet etch processes, or combinations thereof. In some embodiments, the portion of the mask layer 134 (FIG. 1A) is removed by a dry etch process, the portion of the buffer layer 132 is removed by a wet etch process, and the portions of the passivation layer 130, the MIM structure 118, the dielectric layer 116, and the etch stop layer 114 are removed by one or more dry etch processes. The mask layer 134 may be removed as a result of the multiple etch processes.

Figure 1C:
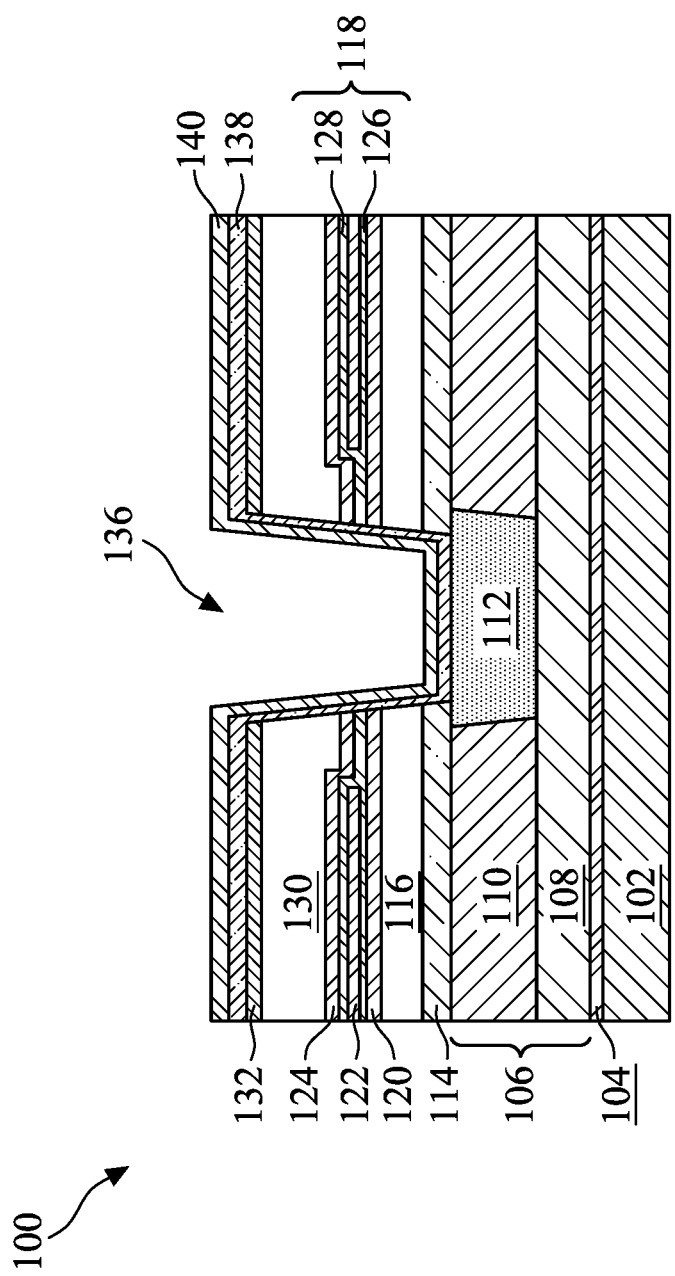

As shown in FIG. 1C, a barrier layer 138 is formed on the buffer layer 132 and in the opening 136, and a seed layer 140 is formed on the barrier layer 138. The barrier layer 138 may prevent diffusion of metal from a subsequently formed redistribution layer 142 (FIG. 1D) into the passivation layer 130 and the dielectric layers 116, 126, 128. As shown in FIG. 1C, the barrier layer 138 is in contact with the passivation layer 130, the MIM structure 118, the dielectric layer 116, the etch stop layer 114, and the conductive feature 112. The barrier layer 138 may include a nitride, such as a metal nitride, for example a refractory metal nitride. In some embodiments, the barrier layer 138 includes an electrically conductive material. In some embodiments, the barrier layer 138 includes tantalum nitride (TaN). The barrier layer 138 may be formed by any suitable process, such as ALD, CVD, or PVD. In some embodiments, the barrier layer 138 is a conformal layer formed by a conformal process. The barrier layer 138 may have a thickness ranging from about 1 nm to about 50 nm. If the thickness of the barrier layer 138 is less than about 1 nm, the barrier layer 138 may not be sufficient to prevent diffusion of metal. On the other hand, if the thickness of the barrier layer 138 is greater than about 50 nm, manufacturing cost may be increased without significant advantages.

In some embodiments, portions of the barrier layer 138 may be removed by an etch process. In order to protect the passivation layer 130, the buffer layer 132 includes a material having different etch selectivity compared to the material of the barrier layer 138. In some embodiments, the thickness of the buffer layer 132 may depend on the thickness of the barrier layer 138. With relatively thicker barrier layer 138, the etch time may be longer during the removal of the portions of the barrier layer 138, and the thickness of the buffer layer 132 may be relatively thicker to compensate for potential over-etching of the portions of the barrier layer 138. On the other hand, with relatively thinner barrier layer 138, the etch time may be shorter during the removal of the portions of the barrier layer 138, and the thickness of the buffer layer 132 may be relatively thinner. In some embodiments, the thickness of the buffer layer 132 may be about 50 percent to about 100 percent of the thickness of the barrier layer 138 in order for the buffer layer 132 to sufficiently protect the passivation layer 130 disposed therebelow.

The seed layer 140 may include the same material as the conductive feature 112 and may be formed by any suitable process, such as ALD, CVD, or PVD. In some embodiments, the seed layer 140 is a conformal layer formed by ALD.

Figure 1D:
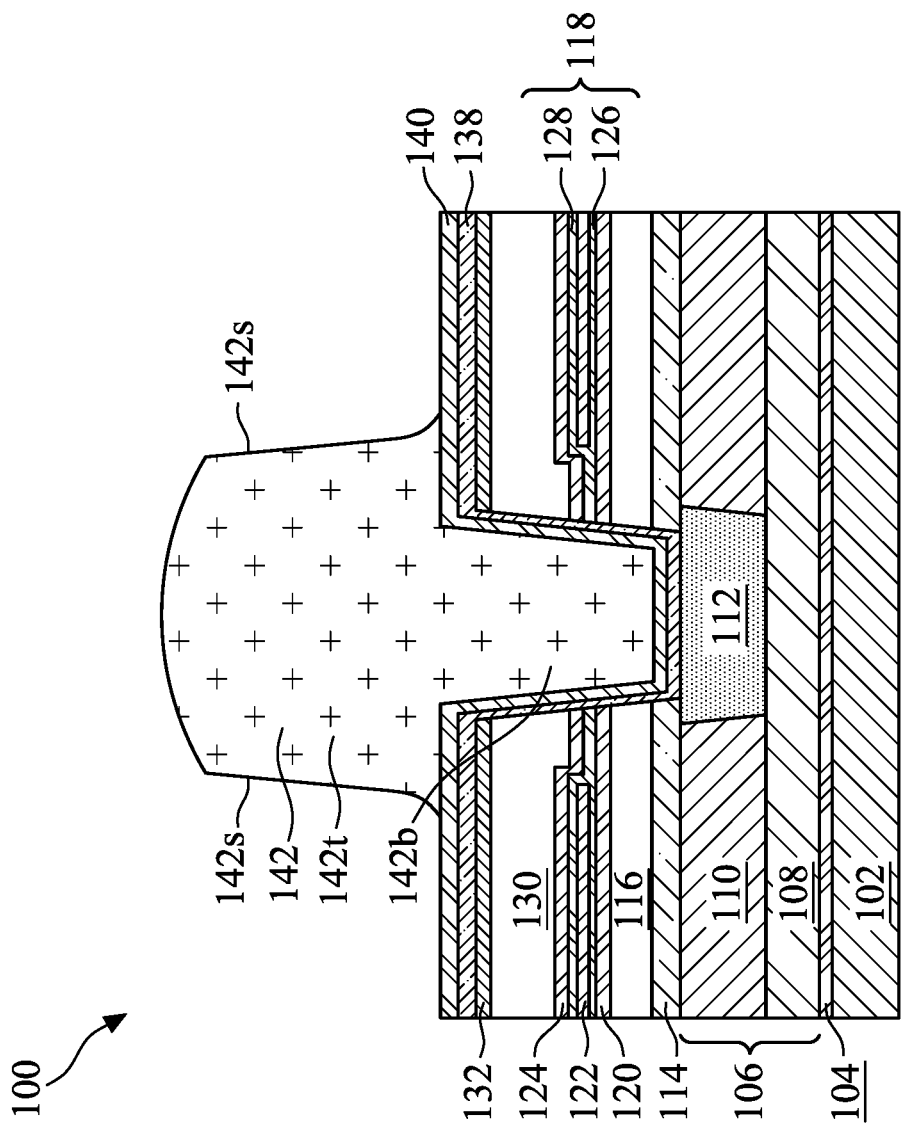

As shown in FIG. 1D, a redistribution layer (RDL) 142 is formed in the opening 136 (FIG. 1C) and over portions of the passivation layer 130 and portions of the barrier layer 138. The RDL 142 may be formed by first forming a sacrificial layer (not shown) in the opening 136 and over the passivation layer 130. The sacrificial layer may be formed on the seed layer 140. In some embodiments, the sacrificial layer is a resist layer. The sacrificial layer may be patterned so the portions of the sacrificial layer disposed in the opening 136 and over portions of the passivation layer 130 are removed. In other words, an opening is formed by removing the portions of the sacrificial layer. The opening may include the opening 136 (FIG. 1C) and a larger opening in the sacrificial layer over the opening 136 and over portions of the passivation layer 130. Then, the RDL 142 is formed in the opening, and the sacrificial layer is removed by a stripping process. The RDL 142 formed by this process does not experience a dry etch process, which may affect the roughness of the side surfaces 142s of the RDL 142. Subsequently formed adhesion layer 144 (FIG. 1E) on the side surfaces 142s may have poor adhesion to the side surfaces 142s if the side surfaces 142s have exposed to a dry etch process. Thus, without using a dry etch process to form the RDL 142, the adhesion layer 144 (FIG. 1E) may have improved adhesion to the side surfaces 142s of the RDL 142.

The RDL 142 may include an electrically conductive material, such as a metal. The RDL 142 may include the same material as the seed layer 140. In some embodiments, the seed layer 140 and the RDL 142 include Cu. In some embodiments, the seed layer 140 is optional, and the RDL 142 is formed on the barrier layer 138. The RDL 142 may extend through the passivation layer 130, the MIM structure 118, and the dielectric layer 116. The RDL 142 may be electrically connected to the conductive feature 112 and the first and third electrode layers 120, 124 of the MIM structure 118. The RDL 142 may be formed by any suitable process, such as PVD or ECP. The RDL 142 includes a bottom portion 142b disposed in the opening 136 (FIG. 1C) and a top portion 142t located over the bottom portion. In some embodiments, the bottom portion 142b may be a conductive via, and the top portion 142t may be a conductive line. The top portion 142t of the RDL 142 may be disposed on portions of the seed layer 140, and the rest of the seed layer 140 may be exposed.

Figure 1E:
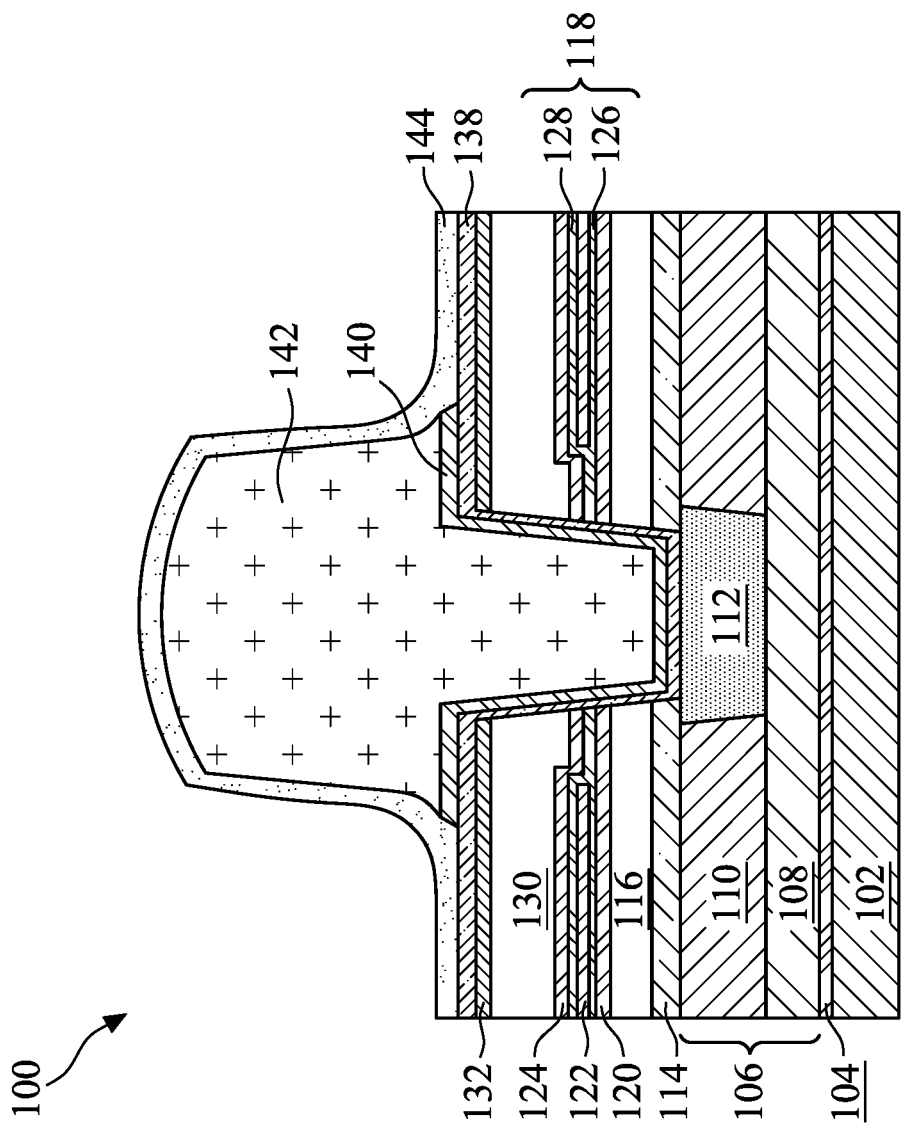

As shown in FIG. 1E, the exposed portions of the seed layer 140 are removed, and the adhesion layer 144 is formed on the top portion 142t of the RDL 142. The removal of the exposed portions of the seed layer may be performed by a wet etch process. The wet etch process may remove insignificant amount of the top portion 142t of the RDL 142. However, because it is not a dry etch process, adhesion of the adhesion layer 144 to the top portion 142t of the RDL 142 is not substantially affected. The adhesion layer 144 may be formed on portions of the barrier layer 138 and on the top portion 142t of the RDL 142. The adhesion layer 144 may be a nitride, such as SiN. In some embodiments, the RDL 142 has a tensile stress, and the adhesion layer 144 also has a tensile stress in order to better adhere to the top portion 142t of the RDL 142. The adhesion layer 144 may be formed by any suitable process, such as ALD, CVD, PECVD, or PVD. The adhesion layer 144 may have a thickness ranging from about 10 nm to about 50 nm.

Figure 1F:
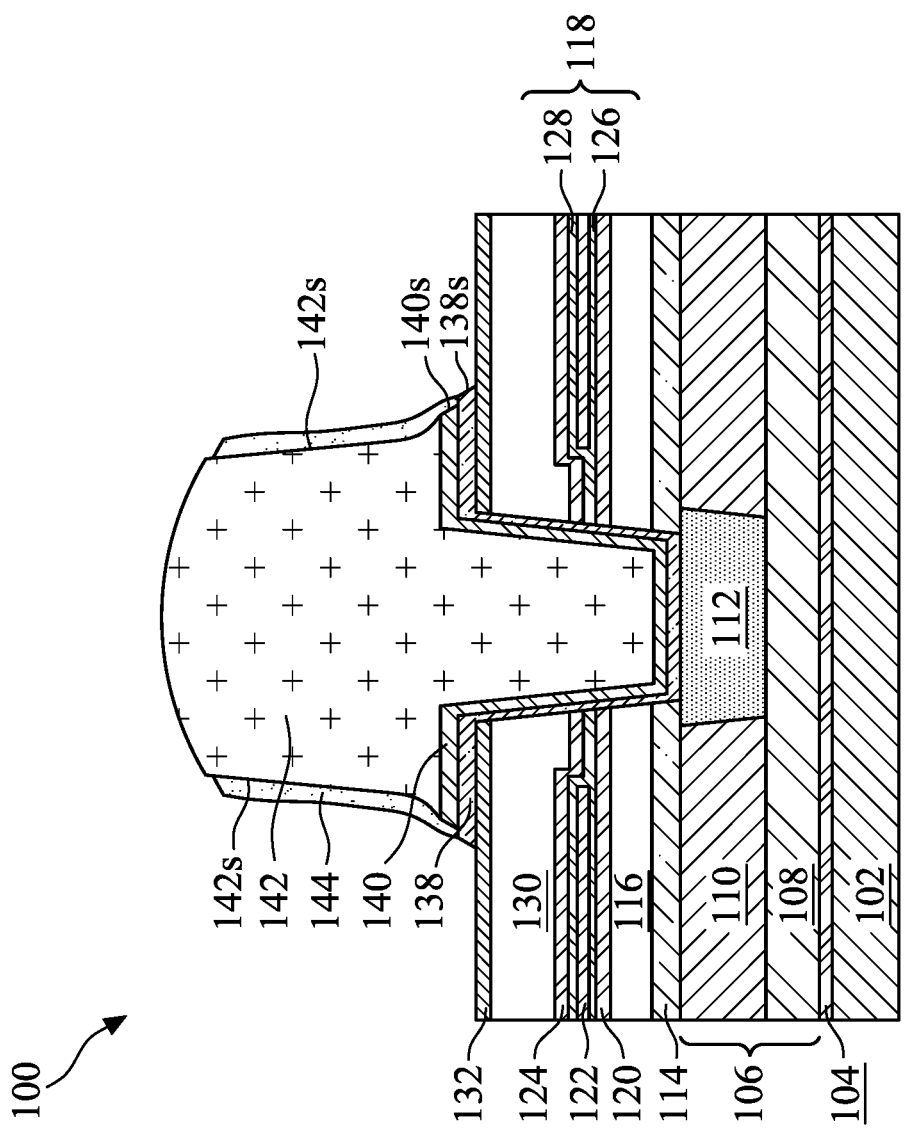

As shown in FIG. 1F, portions of the adhesion layer 144 and portions of the barrier layer 138 are removed. The portions of the adhesion layer 144 may be removed by an anisotropic etch process. The anisotropic etch process may be a dry etch process that removes portions of the adhesion layer 144 formed on horizontal surfaces, such as the portions of the adhesion layer 144 formed on the top surface of top portion 142t of the RDL 142 and on the barrier layer 138. As a result, the portions of the barrier layer 138 located under the removed portions of the adhesion layer 144 are exposed, and the side surfaces 142s are covered by the adhesion layer 144.

Next, because the barrier layer 138 may include an electrically conductive material, the exposed portions of the barrier layer 138 may be removed. In order to protect the side surfaces 142s of the top portion 142t of the RDL 142, the adhesion layer 144 is formed on the side surfaces 142s of the top portion 142t of the RDL 142 prior to the removal of the exposed portions of the barrier layer 138. Thus, instead of removing the exposed portions of the barrier layer 138 immediately after the removal of the exposed portions of the seed layer 140, additional processes may be performed, such as forming the adhesion layer 144 and removing portions of the adhesion layer 144 to expose portions of the barrier layer 138, in order to protect the side surfaces 142s of the top portion 142t of the RDL 142.

In some embodiments, the removal of the exposed portions of the barrier layer 138 may be performed by a selective etch process that does not substantially affect the RDL 142, the adhesion layer 144, and the buffer layer 132. For example, a selective dry etch process may be used to remove the exposed portions of the barrier layer 138. As described above, the buffer layer 132 protects the passivation layer 130 during the removal of the exposed portions of the barrier layer 138. Without the buffer layer 132, the passivation layer 130 may be recessed during the removal of the exposed portions of the barrier layer 138. The recessed passivation layer 130 may lead to cracks forming in the passivation layer 130 due to stress from subsequently formed conductive feature 152 (FIG. 1I), and the cracks may damage the MIM structure 118 to cause dielectric breakdown voltage failure. Thus, with the buffer layer 132 protecting the passivation layer 130, recessing of the passivation layer 130 is avoided, and dielectric breakdown voltage failure is reduced. Furthermore, recess loading in iso-dense areas is also improved as the result of having the buffer layer 132.

As shown in FIG. 1F, after the removal of the exposed portions of the barrier layer 138, side surfaces 138s of the barrier layer 138 are exposed. The seed layer 140 includes side surfaces 140s, and the adhesion layer 144 is in contact with the barrier layer 138, the side surfaces 140s of the seed layer 140, and the side surfaces 142s of the top portion 142t of the RDL 142. The side surfaces 138s of the barrier layer 138 may extend outward from the side surfaces 140s of the seed layer 140, and the difference between the side surface 138s and the side surface 140s may be the thickness of the adhesion layer 144, which may range from about 10 nm to about 50 nm.

Figure 1G:
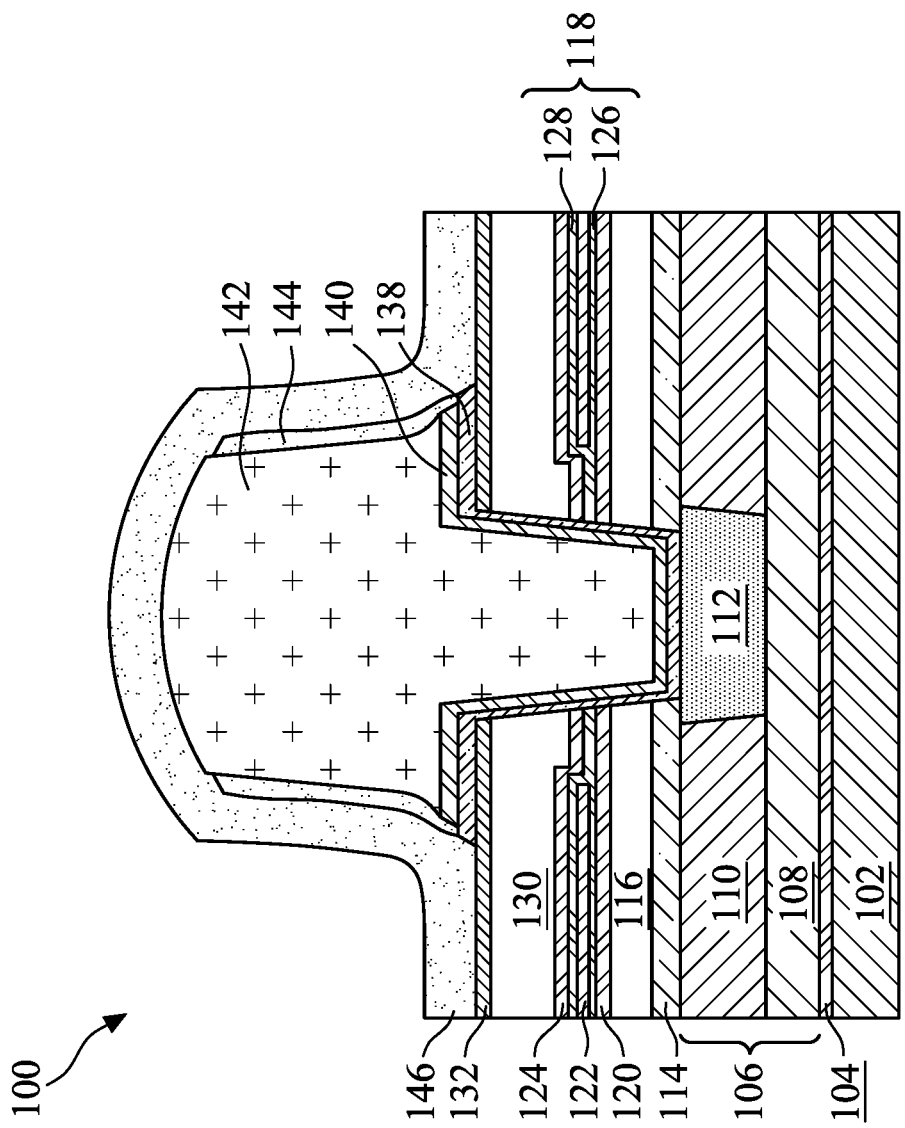

As shown in FIG. 1G, a passivation layer 146 is formed on the buffer layer 132, the side surfaces 138s of the barrier layer 138, the adhesion layer 144, and the top surface of the top portion 142t of the RDL 142. The passivation layer 146 may include the same material as the adhesion layer 144, so the passivation layer 146 is adhered to the adhesion layer 144. In some embodiments, the passivation layer 146 has compressive stress in order to protect the RDL 142 from the compressive stress of the subsequently formed conductive feature 152 (FIG. 1I). The passivation layer 146 with compressive stress may not adhere to the side surfaces 142s of the top portion 142t of the RDL 142. Thus, as described above, the adhesion layer 144 with tensile stress is utilized so the passivation layer 146 can adhere to the adhesion layer 144, and the adhesion layer 144 can adhere to the side surfaces 142s of the top portion 142t of the RDL 142.

In some embodiments, the adhesion layer 144 and the passivation layer 146 include the same material but have different stress. The stress of the adhesion layer 144 and the passivation layer 146 can be controlled by various factors, such as plasma power and/or precursor flow. For example, in some embodiments, the adhesion layer 144 includes SiN having tensile stress and is formed by a first PECVD process. The passivation layer 146 includes SiN having compressive stress and is formed by a second PECVD process. The first PECVD process has a first plasma power and a first silicon-containing precursor flow rate. The second PECVD process has a second plasma power substantially greater than the first plasma power and a second silicon-containing precursor flow rate substantially greater than the first silicon-containing precursor flow rate. The silicon-containing precursor in both the first and second PECVD processes may be silane.

In some embodiments, the passivation layer 146 has a thickness ranging from about 500 nm to about 1500 nm, such as from about 800 nm to about 1200 nm. As described above, the adhesion layer 144 has a thickness ranging from about 10 nm to about 50 nm. In some embodiments, the thickness of the passivation layer 146 may be about 10 to 150 times the thickness of the adhesion layer 144. If the thickness of the passivation layer 146 is less than about 10 times the thickness of the adhesion layer 144, the passivation layer 146 may not sufficiently protect the RDL 142 from the stress of the conductive feature 152 (FIG. 1I). On the other hand, if the thickness of the passivation layer 146 is more than about 150 times the thickness of the adhesion layer 144, the risk of the passivation layer 146 being peeled away from the RDL 142 is increased.

As shown in FIG. 1G, in some embodiments, the passivation layer 130 is disposed on and in contact with the MIM structure 118, the buffer layer 132 is disposed on and in contact with the passivation layer 130, the passivation layer 146 is disposed on and in contact with a first portion of the buffer layer 132, the barrier layer 138 is disposed on and in contact with a second portion of the buffer layer 132, the adhesion layer 144 is disposed on and in contact with a first portion of the barrier layer 138, and the seed layer 140 is disposed on and in contact with a second portion of the barrier layer 138. The barrier layer 138 may be in contact with the passivation layer 130, the first and third electrode layers 120, 124, the dielectric layer 116, the etch stop layer 114, and the conductive feature 112.

Figure 1H:
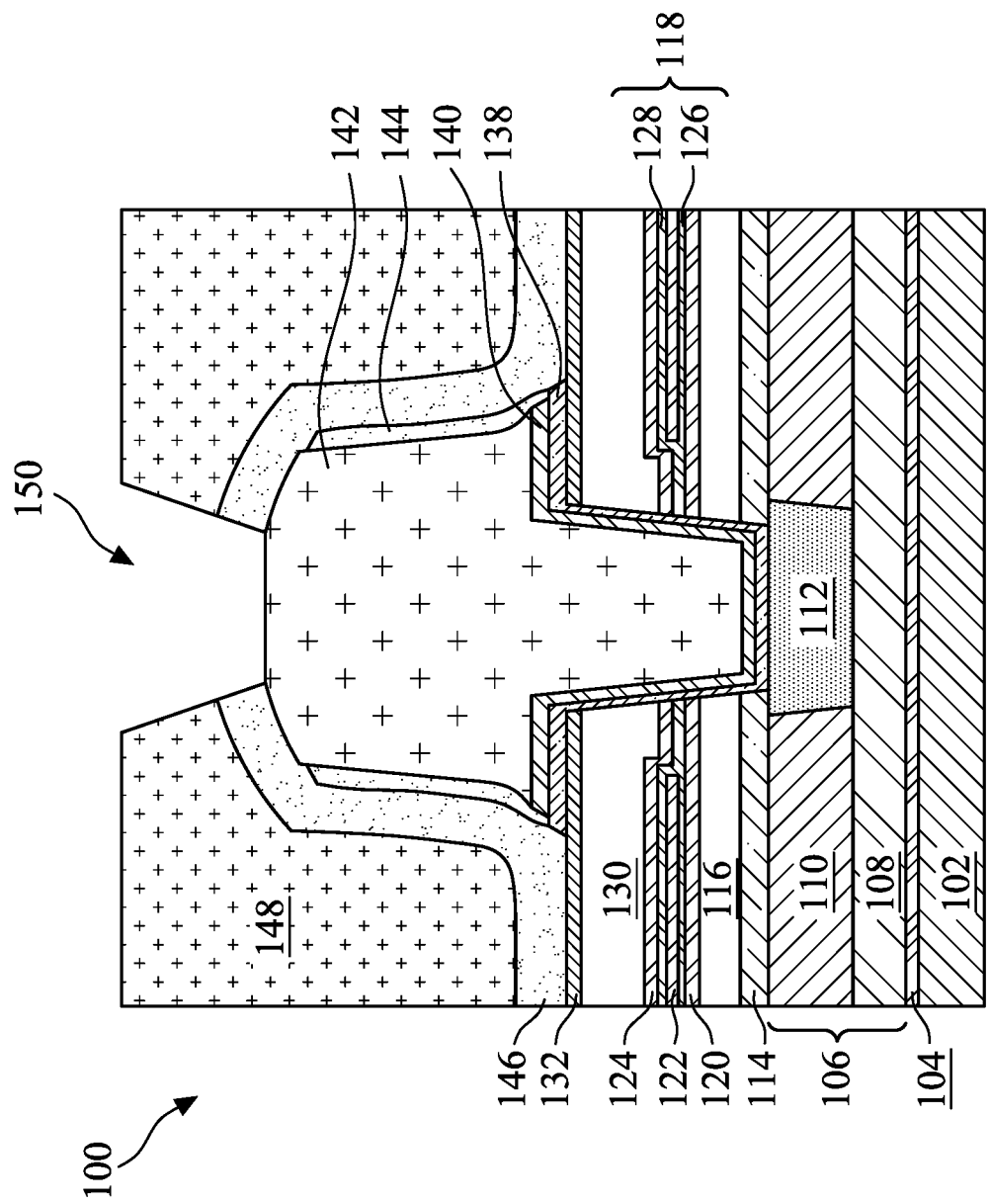
Figure 1I:
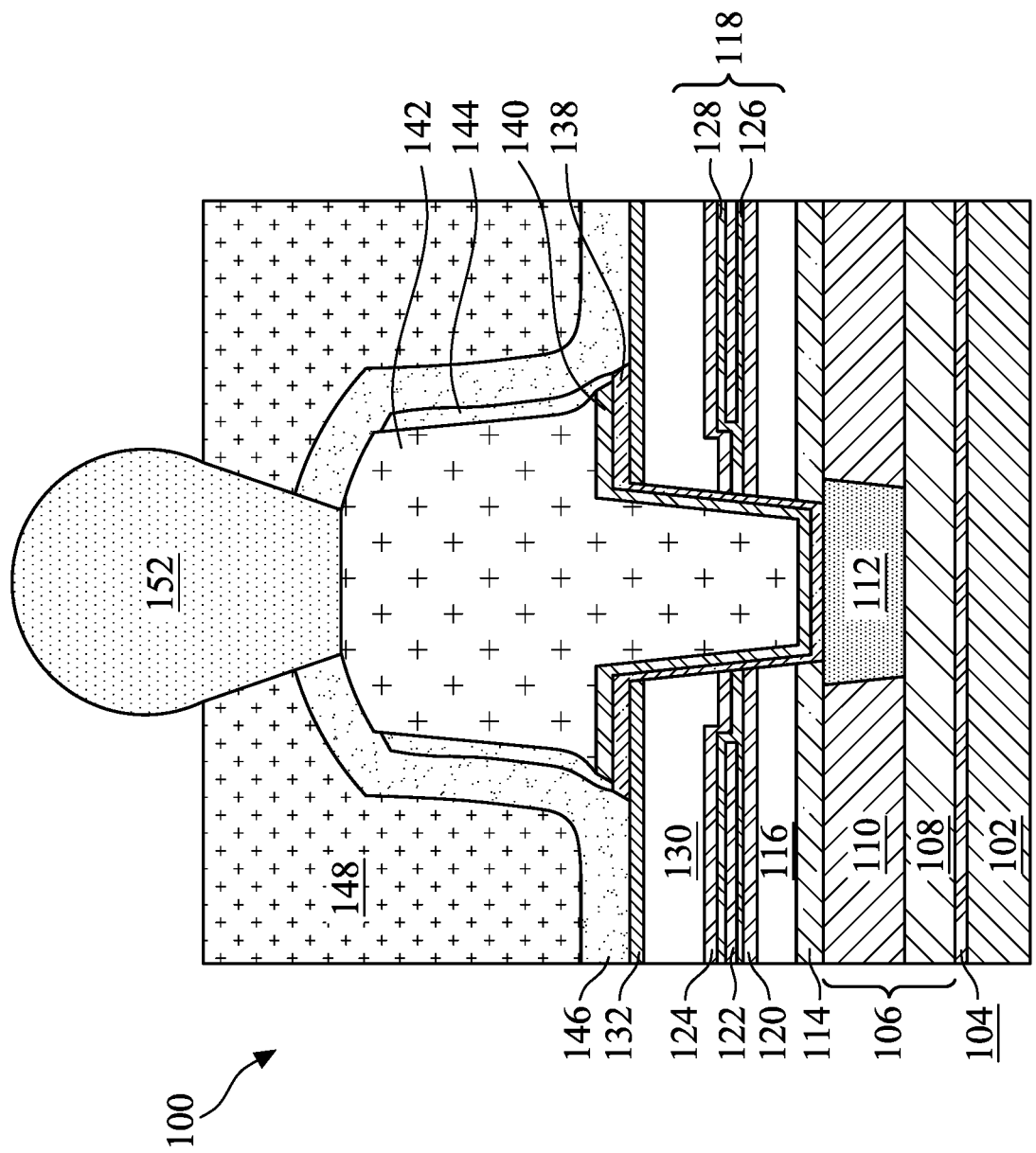

As shown in FIG. 1H, a dielectric material 148 is formed on the passivation layer 146, and an opening 150 is formed in the dielectric material 148 and the passivation layer 146 to expose the RDL 142. The dielectric material 148 may be any suitable dielectric material. In some embodiments, the dielectric material 148 is a polymer, such as polyimide. The dielectric material 148 may be formed by any suitable process, such as spin coating, CVD, FCVD, or laminating. The opening 150 may be formed by any suitable process, such as dry etch, wet etch, or a combination thereof.

As shown in FIG. 1I, the conductive feature 152 is formed in the opening 150 (FIG. 1H). In some embodiments, the conductive feature 152 may be in contact with the RDL 142. The conductive feature 152 may include an electrically conductive material, such as a metal. In some embodiments, the conductive feature 152 includes Cu, Ni, Au, Ag, Pd, Al, Sn, or other suitable metal. In some embodiments, the conductive feature 152 is a conductive bump, as shown in FIG. 1I. As shown in FIG. 1I, in some embodiments, the passivation layer 146 is in contact with the buffer layer 132, the barrier layer 138, the adhesion layer 144, the RDL 142, the dielectric material 148, and the conductive feature 152.

The present disclosure in various embodiments provides a buffer layer 132 disposed on a passivation layer 130 for protecting the passivation layer 130 during the removal of portions of a barrier layer 138 formed on the buffer layer 132. The thickness of the buffer layer 132 may be about 50 percent to about 100 percent of the thickness of the barrier layer 138. A passivation layer 146 may be disposed on the buffer layer 132 and in contact with the barrier layer 138, and an adhesion layer 144 is disposed on the barrier layer 138 and in contact with an RDL 142. The adhesion layer 144 and the passivation layer 146 may include the same material but have different stress. The adhesion layer 144 may have tensile stress while the passivation layer 146 may have compressive stress. Some embodiments may achieve advantages. For example, the buffer layer 132 prevents the passivation layer 130 from being recessed, leading to reduced cracks in the passivation layer 130, which in turn reduces dielectric breakdown voltage failure. Furthermore, recess loading in iso-dense areas is also improved as the result of having the buffer layer 132. In addition, the adhesion layer 144 having tensile stress adheres to the RDL 142, while the passivation layer 146 having compressive stress protects the RDL 142 by release the stress from the conductive feature 152.

An embodiment is a device structure. The device structure includes a structure, a first passivation layer disposed on the structure, a buffer layer disposed on the first passivation layer, a barrier layer disposed on a first portion of the buffer layer, a redistribution layer disposed over the barrier layer, an adhesion layer disposed on the barrier layer and on side surfaces of the redistribution layer, and a second passivation layer disposed on a second portion of the buffer layer. The second passivation layer is in contact with the barrier layer, the adhesion layer, and the redistribution layer.

Another embodiment is a device structure. The device structure includes a structure, a first passivation layer disposed on the structure, a buffer layer disposed on the first passivation layer, wherein the buffer layer has a first thickness, and a barrier layer disposed on the buffer layer. The barrier layer has a second thickness, and the first thickness is about 50 percent to about 100 percent of the second thickness. The device structure further includes a redistribution layer disposed over the barrier layer, an adhesion layer disposed on side surfaces of the redistribution layer, and a second passivation layer disposed on the buffer layer and the adhesion layer. The adhesion layer and the second passivation layer comprise a same material, the adhesion layer having tensile stress, and the second passivation layer having compressive stress.

A further embodiment is a method. The method includes forming an opening in a buffer layer, a first passivation layer, and a structure, forming a barrier layer on the buffer layer and in the opening, forming a redistribution layer over first portions of the barrier layer in the opening, and forming an adhesion layer on second portions of the barrier layer. The adhesion layer is in contact with the barrier layer and the redistribution layer. The method further includes removing portions of the adhesion layer formed on the second portions of the barrier layer to expose the second portions of the barrier layer, removing the second portions of the barrier layer to expose portions of the buffer layer, and forming a second passivation layer on the exposed portions of the buffer layer, the adhesion layer, and the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming an opening in a buffer layer, a first passivation layer, and a structure;
    forming a barrier layer on the buffer layer and in the opening;
    forming a redistribution layer over first portions of the barrier layer in the opening;
    forming an adhesion layer on second portions of the barrier layer, wherein the adhesion layer is in contact with the barrier layer and the redistribution layer;
    removing portions of the adhesion layer formed on the second portions of the barrier layer to expose the second portions of the barrier layer;
    removing the second portions of the barrier layer to expose portions of the buffer layer; and
    forming a second passivation layer on the exposed portions of the buffer layer, the adhesion layer, and the redistribution layer.

2. The method of claim 1, further comprising forming a seed layer on the barrier layer, wherein the redistribution layer is formed on the seed layer.

3. The method of claim 2, further comprising removing portions of the seed layer prior to forming the adhesion layer.

4. The method of claim 3, further comprising forming a dielectric material on the second passivation layer and forming a conductive feature in the dielectric material, wherein the conductive feature is electrically connected to the redistribution layer.

5. The method of claim 1, wherein the structure is a metal-insulator-metal structure.

6. The method of claim 5, wherein the metal-insulator-metal structure is disposed over transistors.

7. A method, comprising:
    depositing a buffer layer on a first passivation layer;
    forming a first opening in the buffer layer and the first passivation layer;
    depositing a barrier layer on the buffer layer and in the first opening;
    forming an electrically conductive material in the first opening, wherein the electrically conductive material is formed over first portions of the barrier layer;
    depositing an adhesion layer on second portions of the barrier layer and on the electrically conductive material;
    removing portions of the adhesion layer formed on the second portions of the barrier layer and on a top surface of the electrically conductive material;
    removing the second portions of the barrier layer to expose portions of the buffer layer; and
    forming a second passivation layer on the exposed portions of the buffer layer, the adhesion layer, and the electrically conductive material.

8. The method of claim 7, wherein the removing the portions of the adhesion layer is performed by an anisotropic etch process.

9. The method of claim 7, further comprising depositing a seed layer in the first opening, wherein the seed layer is deposited on the barrier layer, and the electrically conductive material is formed on the seed layer.

10. The method of claim 7, wherein the buffer layer and the barrier layer comprise materials having different etch selectivity.

11. The method of claim 7, wherein during the removing the second portions of the barrier layer, side surfaces of the electrically conductive material are protected by the adhesion layer.

12. The method of claim 7, further comprising depositing a dielectric material on the second passivation layer.

13. The method of claim 12, further comprising forming a second opening in the dielectric material and the second passivation layer.

14. The method of claim 13, further comprising depositing a conductive feature in the second opening.

15. A method, comprising:
forming an opening in a buffer layer and a first passivation layer;
depositing a barrier layer on the buffer layer and in the opening;
depositing a seed layer on the barrier layer;
forming an electrically conductive material on a first portion of the seed layer; then
removing a second portion of the seed layer to expose a portion of the barrier layer; then
depositing an adhesion layer on the exposed portion of the barrier layer and on the electrically conductive material; then
removing a first portion of the adhesion layer to expose the portion of the barrier layer, wherein a second portion of the adhesion layer remains on side surfaces of the electrically conductive material; and then
removing the exposed portion of the barrier layer to expose a portion of the buffer layer.

16. The method of claim 15, further comprising forming a second passivation layer on the exposed portion of the buffer layer, the adhesion layer, and the electrically conductive material.

17. The method of claim 15, wherein the buffer layer and the first passivation layer are disposed over a metal-insulator-metal structure.

18. The method of claim 17, wherein the opening is formed in the metal-insulator-metal structure.

19. The method of claim 18, wherein the barrier layer is in contact with the metal-insulator-metal structure.

20. The method of claim 17, wherein the metal-insulator-metal structure is disposed over transistors.

* * * * *